(12) United States Patent
Chou

(10) Patent No.: US 11,588,478 B2
(45) Date of Patent: Feb. 21, 2023

(54) DELAY CONTROL DEVICE AND TUNABLE DELAY DEVICE

(71) Applicant: Winbond Electronics Corp., Taichung (TW)

(72) Inventor: Yen-Yu Chou, New Taipei (TW)

(73) Assignee: WINDBOND ELECTRONICS CORP., Taichung (TW)

(*) Notice: Subject to any disclaimer, the term of this patent is extended or adjusted under 35 U.S.C. 154(b) by 4 days.

(21) Appl. No.: 17/369,788

(22) Filed: Jul. 7, 2021

(65) Prior Publication Data
US 2022/0045668 A1 Feb. 10, 2022

(30) Foreign Application Priority Data
Aug. 6, 2020 (TW) ................... 109126719

(51) Int. Cl.
*H03K 5/131* (2014.01)
*H03K 5/135* (2006.01)
*H03K 5/00* (2006.01)

(52) U.S. Cl.
CPC ............. *H03K 5/131* (2013.01); *H03K 5/135* (2013.01); *H03K 2005/00058* (2013.01)

(58) Field of Classification Search
None
See application file for complete search history.

(56) References Cited

U.S. PATENT DOCUMENTS

| | | | |
|---|---|---|---|
| 6,856,558 B1* | 2/2005 | Proebsting | H03K 5/133 365/194 |
| 7,069,459 B2 | 6/2006 | Gauthier et al. | |
| 7,696,802 B2 | 4/2010 | Shin | |
| 7,859,322 B2* | 12/2010 | Takeuchi | G11C 29/12 327/534 |
| 9,377,997 B2* | 6/2016 | Vasyltsov | H03K 3/84 |

FOREIGN PATENT DOCUMENTS

TW     I404073 B1     8/2013

* cited by examiner

*Primary Examiner* — Cassandra F Cox
(74) *Attorney, Agent, or Firm* — Birch, Stewart, Kolasch & Birch, LLP

(57) ABSTRACT

A delay control device for controlling a delay circuit includes an oscillator, a counter, and an output control circuit. The oscillator generates an internal clock signal according to an external clock signal. The counter generates an accumulative signal according to the internal clock signal. The counter is selectively reset by the external clock signal. The output control circuit generates a delay indication signal according to the accumulative signal. The delay time of the delay circuit is adjusted according to the delay indication signal.

20 Claims, 5 Drawing Sheets

DELAY CONTROL DEVICE AND TUNABLE DELAY DEVICE

CROSS REFERENCE TO RELATED APPLICATIONS

This application claims priority of Taiwan Patent Application No. 109126719 filed on Aug. 6, 2020, the entirety of which is incorporated by reference herein.

BACKGROUND OF THE INVENTION

Field of the Invention

The disclosure generally relates to a delay control device, and more specifically, to a delay control device for optimizing a delay time.

Description of the Related Art

Since there are variations of process, voltage, and temperature (hereinafter referred to as "PVT variations") in general delay circuits, the delay time that is generated has obvious variations. To solve this problem, a delay circuit that can sense PVT variations is proposed. However, such a delay circuit still cannot improve the problem of inconsistent delay times for circuits in different locations. This non-ideal characteristic will cause the overall performance of the related circuit to decline. For example, in a memory device, if a conventional delay circuit is used, the delay times of multiple memory banks (such as transmission delay from a column controller to a row controller, called as "tRCD") may vary significantly. Thus, it is necessary to set the specification of the delay time to be longer, resulting in low-efficiency of data output. In order to solve this problem, a delay circuit with a plurality of distributed oscillators is proposed. However, because the inputs and outputs of these oscillators are all coupled to a counter, and the generated delay time is still affected by PVT variations, there is accordingly a need to propose a novel solution for solving the problems of the prior art.

BRIEF SUMMARY OF THE INVENTION

The invention proposes a delay control device and a tunable delay device, whose oscillator and counter are both coupled to an external clock signal. In this way, the influence of PVT variations can be avoided, and the different delay times generated by circuits at different locations can be compensated for, thereby solving the problems of the prior art.

In an exemplary embodiment, the invention provides a delay control device for controlling a delay circuit, and it includes an oscillator, a counter, and an output control circuit. The oscillator generates an internal clock signal according to an external clock signal. The counter generates an accumulative signal according to the internal clock signal. The counter is selectively reset by the external clock signal. The output control circuit generates a delay indication signal according to the accumulative signal. The delay time of the delay circuit is adjusted according to the delay indication signal.

In another exemplary embodiment, the invention provides a tunable delay device that includes an oscillator, a counter, an output control circuit, and a delay circuit. The oscillator generates an internal clock signal according to an external clock signal. The counter generates an accumulative signal according to the internal clock signal. The counter is selectively reset by the external clock signal. The output control circuit generates a delay indication signal according to the accumulative signal. The delay time of the delay circuit is adjusted according to the delay indication signal.

According to the delay control device and the tunable delay device proposed by the invention, the oscillator is coupled to the external clock signal, and the counter is selectively reset by the external clock signal. Thus, even if there are PVT variations or circuits at different positions, the delay control device can still optimize the delay time of the delay circuit, thereby improving the overall operating performance of the related circuit.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
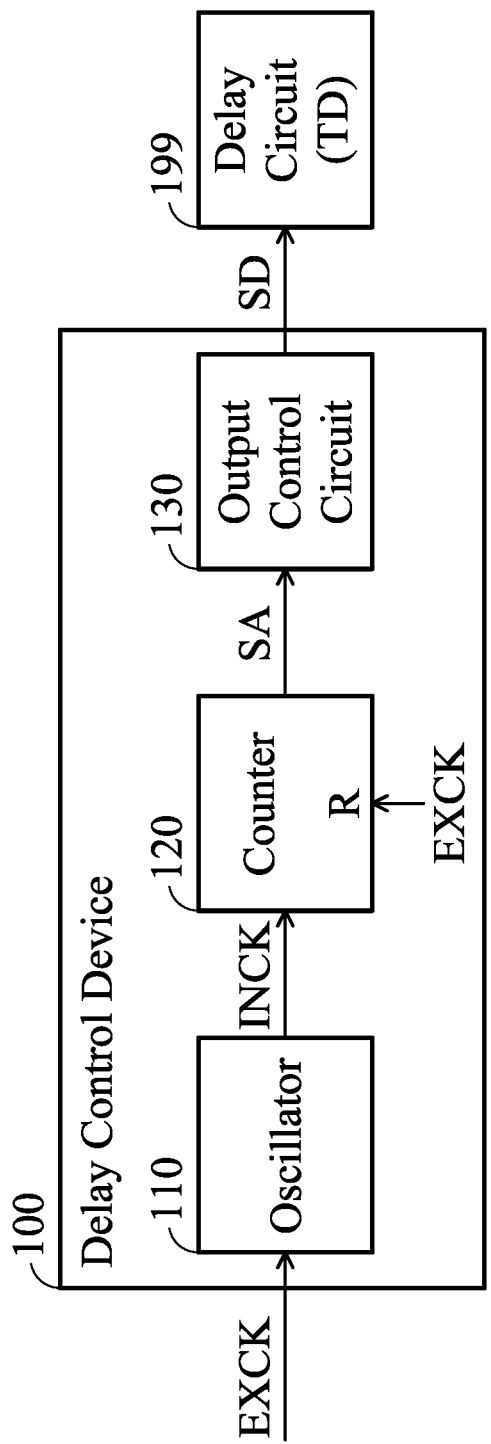
FIG. 1 is a diagram of a delay control device according to an embodiment of the invention.

FIG. 1 is a diagram of a delay control device 100 according to an embodiment of the invention. The delay control device 100 may be applied in an electronic device, such as a mobile device or a memory device, but it is not limited thereto. As shown in FIG. 1, the delay control device 100 controls a delay circuit 199 and includes an oscillator 110, a counter 120, and an output control circuit 130. The oscillator 110 generates an internal cock signal INCK according to an external clock signal EXCK. It should be noted that the frequency and period of the external clock signal EXCK are predetermined and not changed by PVT variations of relative circuitry. The counter 120 generates an accumulative signal SA according to the internal clock signal INCK. The counter 120 is selectively reset by the external clock signal EXCK. For example, the accumulative signal SA of the counter 120 may be reset to 0 at every falling edge or every rising edge of the external clock signal EXCK. The output control circuit 130 generates a delay indication signal SD according to the accumulative signal SA. A delay time TD of the delay circuit 199 is adjusted according to the delay indication signal SD. For example, the delay circuit 199 may receive an input signal (not shown) and output an output signal (not shown), and the delay time TD may be defined as a propagation delay time between the output signal and the input signal. In some embodiments, if the delay indication signal SD shows that the operation speed of circuitry is relatively low, the delay time TD of the delay circuit 199 will become shorter; conversely, if the delay indication signal SD shows that the operation speed of circuitry is relatively high, the delay time TD of the delay circuit 199 will become longer. With such a design, the delay control device 100 can automatically optimize the delay time TD of the delay circuit 199, and it can effectively improve the overall performance of relative circuitry even if there are PVT variations.

Figure 2:
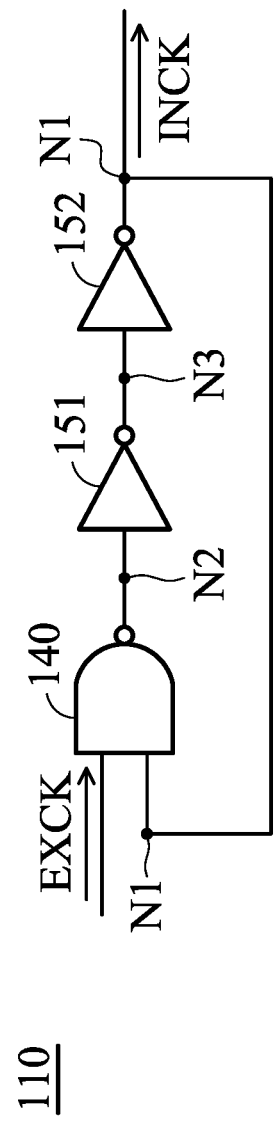
FIG. 2 is a diagram of an oscillator according to an embodiment of the invention.

FIG. 2 is a diagram of the oscillator 110 according to an embodiment of the invention. In the embodiment of FIG. 2, the oscillator 110 includes a NAND gate 140, a first inverter 151, and a second inverter 152. The NAND gate 140 is coupled to a first node N1 and is also configured to receive the external clock signal EXCK. The NAND gate 140 performs a logical NAND operation to the value at the first node N1 and the external clock signal EXCK. An output terminal of the NAND gate 140 is coupled to a second node N2. The first inverter 151 has an input terminal coupled to the second node N2, and an output terminal coupled to a third node N3. The second inverter 152 has an input terminal coupled to the third node N3, and an output terminal coupled to the first node N1 for outputting the internal clock signal INCK. That is, the output terminal of the second inverter 152 may be directly fed back to a second input terminal of the NAND gate 140. It should be noted that although there are only the first inverter 151 and the second inverter 152 displayed in FIG. 2, the oscillator 110 may further include any even number (e.g., 4, 6 or 8) of inverters coupled in series in other embodiments.

Figure 3:
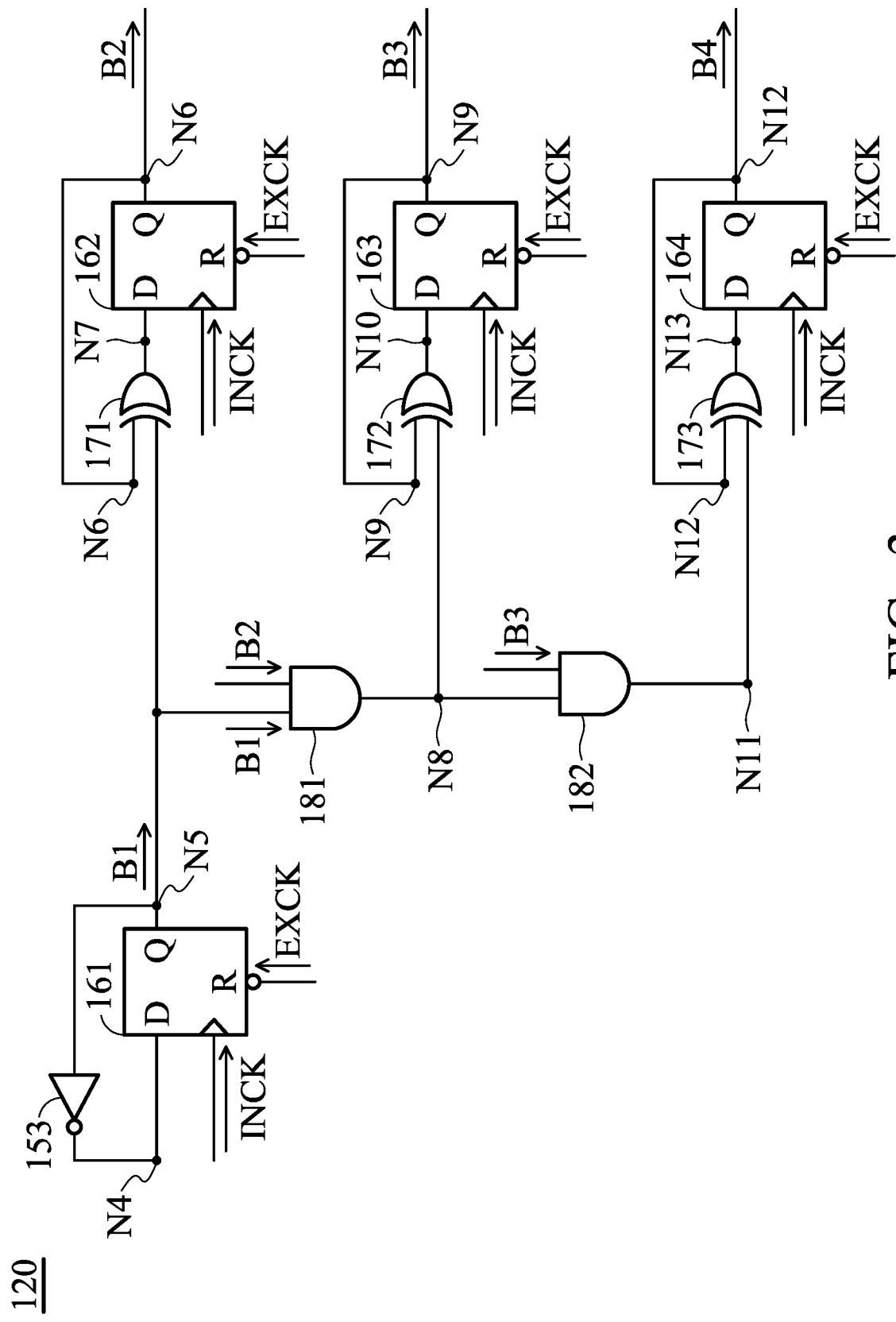
FIG. 3 is a diagram of a counter according to an embodiment of the invention.

FIG. 3 is a diagram of the counter 120 according to an embodiment of the invention. For example, the counter 120 may be implemented with a 4-bit adder, and the accumulative signal SA may include a first bit B1, a second bit B2, a third bit B3, and a fourth bit B4. The counter 120 includes a third inverter 153, a first D flip-flop 161, a second D flip-flop 162, a third D flip-flop 163, a fourth D flip-flop 164, a first XOR gate 171, a second XOR gate 172, a third XOR gate 173, a first AND gate 181, and a second AND gate 182.

The first D flip-flop 161 has a clock terminal for receiving the internal clock signal INCK, an inverted reset terminal for receiving the external clock signal EXCK, a data terminal coupled to a fourth node N4, and an output terminal coupled to a fifth node N5 for outputting the first bit B1. The third inverter 153 has an input terminal coupled to the fifth node N5, and an output terminal coupled to the fourth node N4. That is, the output terminal of the first D flip-flop 161 is fed back through the third inverter 153 to the data terminal of the first D flip-flop 161. At every falling edge of the external clock signal EXCK, the first bit B1 may be reset to 0.

Input terminals of the first XOR gate 171 are coupled to the first D flip-flop 161 and the second D flip-flop 162, so as to receive the first bit B1 from the fifth node N5 and receive the second bit B2 from the sixth node N6. The first XOR gate 171 is configured to perform a logical XOR operation to the first bit B1 and the second bit B2, and output the operation result to a seventh node N7. The second D flip-flop 162 has a clock terminal for receiving the internal clock signal INCK, an inverted reset terminal for receiving the external clock signal EXCK, a data terminal coupled to the seventh node N7, and an output terminal coupled to the sixth node N6 for outputting the second bit B2. That is, the output terminal of the second D flip-flop 162 is directly fed back to the input terminal of the first XOR gate 171. At every falling edge of the external clock signal EXCK, the second bit B2 may be reset to 0.

The first AND gate 181 is configured to receive the first bit B1 and the second bit B2, perform a logical AND operation to the first bit B1 and the second bit B2, and output the operation result to an eighth node N8. Input terminals of the second XOR gate 172 are coupled to the first AND gate 181 and the third D flip-flop 163, so as to receive the output of the first AND gate 181 from the eighth node N8, and receive the third bit B3 from a ninth node N9. The second XOR gate 172 is configured to perform a logical XOR operation to the output of the first AND gate 181 and the third bit B3, and output the operation result to a tenth node N10. The third D flip-flop 163 has a clock terminal for receiving the internal clock signal INCK, an inverted reset terminal for receiving the external clock signal EXCK, a data terminal coupled to the tenth node N10, and an output terminal coupled to the ninth node N9 for outputting the third bit B3. That is, the output terminal of the third D flip-flop 163 is directly fed back to a first terminal of the second XOR gate 172. At every falling edge of the external clock signal EXCK, the third bit B3 may be reset to 0.

An output terminal of the second AND gate 182 is coupled to the first AND gate 181 and the third D flip-flop 163, so as to receive the output of the first AND gate 181 from the eighth node N8, and receive the third bit B3. The second AND gate 182 is configured to perform a logical AND operation to the output of the first AND gate 181 and the third bit B3, and output the operation result to an eleventh node N11. Input terminals of the third XOR gate 173 are coupled to the second AND gate 182 and the fourth D flip-flop 164, so as to receive the output of the second AND gate 182 from the eleventh node N11, and receive the fourth bit B4 from the twelfth node N12. The third XOR gate 173 is configured to perform a logical XOR operation to the output of the second AND gate 182 and the fourth bit B4, and output the operation result to a thirteenth node N13. The fourth D flip-flop 164 has a clock terminal for receiving the internal clock signal INCK, an inverted reset terminal for receiving the external clock signal EXCK, a data terminal coupled to the thirteenth node N13, and an output terminal coupled to the twelfth node N12 for outputting the fourth bit B4. That is, the output terminal of the fourth D flip-flop 164 is directly fed back to a first input terminal of the third XOR gate 173. At every falling edge of the external clock signal EXCK, the fourth bit B4 may be reset to 0. It should be noted that the invention is not limited thereto. In alternative embodiments, the counter 120 is implemented with an adder which has more or fewer bits, and the total bit number of the accumulative signal SA is correspondingly adjusted.

Figure 4:
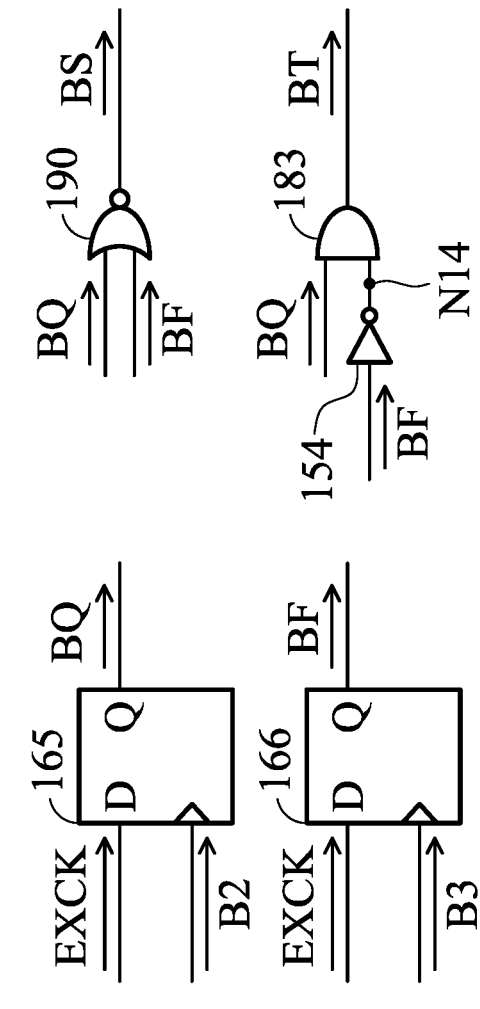
FIG. 4 is a diagram of a output control circuit according to an embodiment of the invention.

FIG. 4 is a diagram of the output control circuit 130 according to an embodiment of the invention. For example, the output control circuit 130 may be used as a decoder, and the delay indication signal SD may include a temporary bit BQ, a low-speed bit BS, a median-bit BT, and a high-speed bit BF. In the embodiment of FIG. 4, the output control circuit 130 includes a fifth D flip-flop 165, a sixth D flip-flop 166, a NOR gate 190, a fourth inverter 154, and a third AND gate 183. The fifth D flip-flop 165 has a clock terminal for receiving the second bit B2, a data terminal for receiving the external clock signal EXCK, and an output terminal for outputting the temporary bit BQ. The sixth D flip-flop 166 has a clock terminal for receiving the third bit B3, a data terminal for receiving the external clock signal EXCK, and an output terminal for outputting the high-speed bit BF. The NOR gate 190 is configured to receive the temporary bit BQ and the high-speed bit BF, perform a logical NOR operation to the temporary bit BQ and the high-speed bit BF, and output the low-speed bit BS. The fourth inverter 154 has an input terminal for receiving the high-speed bit BF, and an output terminal coupled to a fourteenth node N14. The third AND gate 183 is coupled to the fourteenth node N14 and also configured to receive the temporary bit BQ, perform a logical AND operation to the inverse of the high-speed bit BF and the temporary bit BQ, and output the median-speed bit BT. It should be noted that neither the fifth D flip-flop 165 nor the sixth D flip-flop 166 uses any (inverted) reset terminal, and thus none of the temporary bit BQ, the low-speed bit BS, the median-speed bit BT, and the high-speed bit BF is reset to 0.

In some embodiments, the bit truth table of the delay control device 100 is described as the following Table I.

TABLE I

Bit Truth Table of Delay Control Device

| B4 | B3 | B2 | B1 | BQ | BS | BT | BF |
|----|----|----|----|------|----|----|----|
| 0 | 0 | 0 | 0 | 0 | 1 | 0 | 0 |
| 0 | 0 | 0 | 1 | 0 | 1 | 0 | 0 |
| 0 | 0 | 1 | 0 | 1 | 0 | 1 | 0 |
| 0 | 0 | 1 | 1 | 1 | 0 | 1 | 0 |
| 0 | 1 | 0 | 0 | 0 or 1 | 0 | 0 | 1 |
| 0 | 1 | 0 | 1 | 0 or 1 | 0 | 0 | 1 |
| 0 | 1 | 1 | 0 | 0 or 1 | 0 | 0 | 1 |
| 0 | 1 | 1 | 1 | 0 or 1 | 0 | 0 | 1 |
| 1 | 0 | 0 | 0 | 0 or 1 | 0 | 0 | 1 |
| 1 | 0 | 0 | 1 | 0 or 1 | 0 | 0 | 1 |
| 1 | 0 | 1 | 0 | 0 or 1 | 0 | 0 | 1 |
| 1 | 0 | 1 | 1 | 0 or 1 | 0 | 0 | 1 |
| 1 | 1 | 0 | 0 | 0 or 1 | 0 | 0 | 1 |
| 1 | 1 | 0 | 1 | 0 or 1 | 0 | 0 | 1 |
| 1 | 1 | 1 | 0 | 0 or 1 | 0 | 0 | 1 |
| 1 | 1 | 1 | 1 | 0 or 1 | 0 | 0 | 1 |

According to Table I as above, if the binary bit combination of the accumulative signal SA is "0000" or "0001", the low-speed bit BS of the delay indication signal SD will be a logic "1" to show that the operation speed of circuitry is relatively low; if the binary bit combination of the accumulative signal SA is "0010" or "0011", the median-speed bit BT of the delay indication signal SD will be a logic "1" to show that the operation speed of circuitry is relatively median; and if the binary bit combination of the accumulative signal SA is greater than or equal to "0100", the high-speed bit BF of the delay indication signal SD will be a logic "1" to show that the operation speed of circuitry is relatively high. It should be understood that the above settings are merely exemplary, and they are adjustable according to the requirements of different circuit designs.

Figure 5:
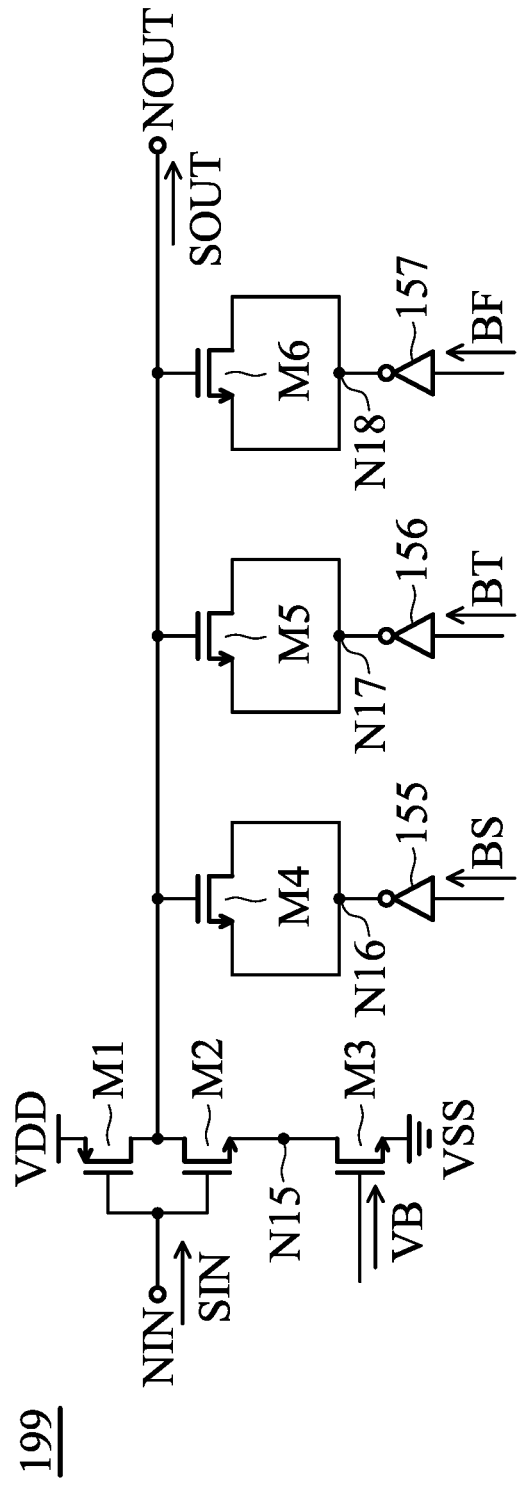
FIG. 5 is a diagram of a delay circuit according to an embodiment of the invention.

FIG. 5 is a diagram of the delay circuit 199 according to an embodiment of the invention. The delay circuit 199 has an input node NIN for receiving an input signal SIN, and an output node NOUT for outputting an output signal SOUT. The delay time TD of the delay circuit 199 is proportional to a transmission time difference between the output signal SOUT and the input signal SIN. In the embodiment of FIG. 5, the delay circuit 199 includes a first transistor M1, a second transistor M2, a third transistor M3, a fourth transistor M4, a fifth transistor M5, a sixth transistor M6, a fifth inverter 155, a sixth inverter 156, and a seventh inverter 157. For example, the first transistor M1 may be a PMOS transistor (P-type Metal Oxide Semiconductor Field Effect Transistor), and each of the second transistor M2, the third transistor M3, the fourth transistor M4, the fifth transistor M5, and the sixth transistor M6 may be an NMOS transistor (N-type Metal Oxide Semiconductor Field Effect Transistor).

The first transistor M1, the second transistor M2, and the third transistor M3 are coupled in series between a supply voltage VDD and a ground voltage VSS. A control terminal of the first transistor M1 and a control terminal of the second transistor M2 are both coupled to the input node NIN. The output node NOUT is coupled between the first transistor M1 and the second transistor M2. Specifically, a first terminal (e.g., a source) of the first transistor M1 is coupled to the supply voltage VDD, and a second terminal (e.g., a drain) of the first transistor M1 is coupled to the output node NOUT. A first terminal of the second transistor M2 is coupled to a fifteenth node N15, and a second terminal of the second transistor M2 is coupled to the output node NOUT. A logical inverter may be formed by the first transistor M1 and the second transistor M2. A control terminal of the third transistor M3 is arranged to receive a bias voltage VB, a first terminal of the third transistor M3 is coupled to the ground voltage VSS, and a second terminal of the third transistor M3 is coupled to the fifteenth node N15. Since the bias voltage VB is substantially maintained at a constant value, the third transistor M3 is considered as a constant current source. In some embodiments, the fourth transistor M4, the fifth transistor M5, and the sixth transistor M6 have different sizes, and they are used as effective capacitors with different capacitances.

A control terminal of the fourth transistor M4 is coupled to the output node NOUT. A first terminal and a second terminal of the fourth transistor M4 are both coupled to a sixteenth node N16. The fifth inverter 155 is configured to receive the low-speed bit BS, and output the inverse of the low-speed bit BS to the sixteenth node N16. Thus, when the low-speed bit BS has a logic "1", the fourth transistor M4 can provide an effective capacitance which is relatively small for the output node NOUT, so as to decrease the delay time TD of the delay circuit 199.

A control terminal of the fifth transistor M5 is coupled to the output node NOUT. A first terminal and a second terminal of the fifth transistor M5 are both coupled to a seventeenth node N17. The sixth inverter 156 is configured to receive the median-speed bit BT, and output the inverse of the median-speed bit BT to the seventeenth node N17. Thus, when the median-speed bit BT has a logic "1", the fifth transistor M5 can provide an effective capacitance which is relatively median for the output node NOUT, so as to maintain the delay time TD of the delay circuit 199.

A control terminal of the sixth transistor M6 is coupled to the output node NOUT. A first terminal and a second terminal of the sixth transistor M6 are both coupled to an eighteenth node N18. The seventh inverter 157 is configured to receive the high-speed bit BF, and output the inverse of the high-speed bit BF to the eighteenth node N18. Thus, when the high-speed bit BF has a logic "1", the sixth transistor M6 can provide an effective capacitance which is relatively large for the output node NOUT, so as to increase the delay time TD of the delay circuit 199. In some embodiments, the ratio of the effective capacitances of the fourth transistor M4 to the fifth transistor M5 to and the sixth transistor M6 can be 2:5:9 (M4:M5:M6), but they are not limited thereto.

Figure 6:
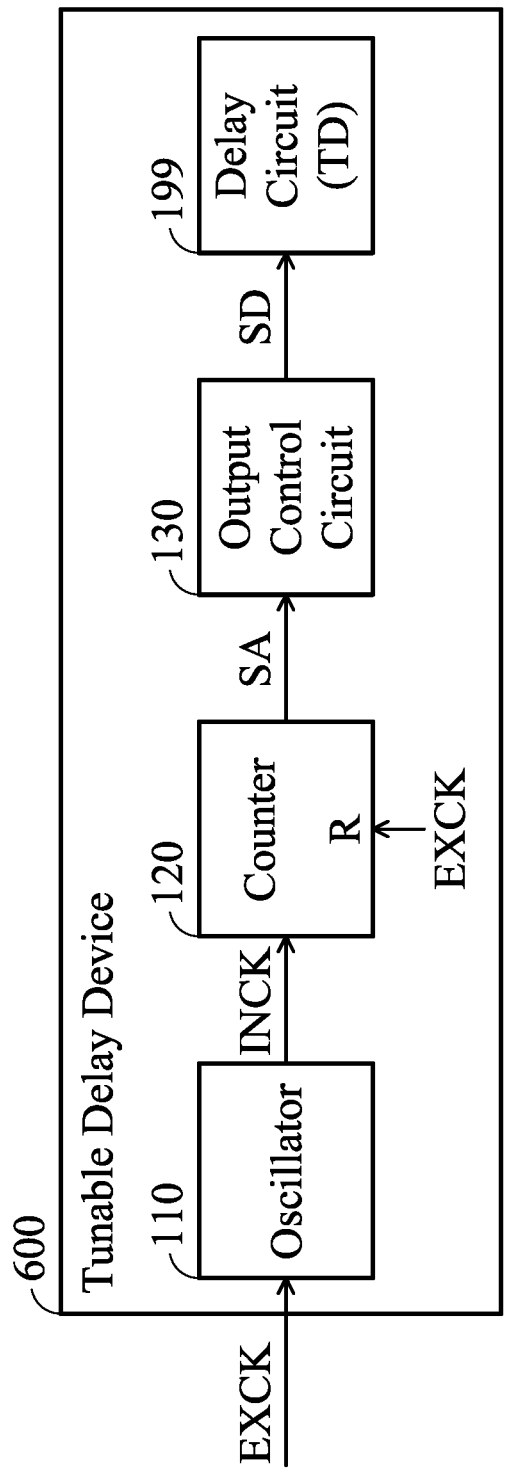
FIG. 6 is a diagram of a tunable delay device according to an embodiment of the invention.

FIG. 6 is a diagram of a tunable delay device 600 according to an embodiment of the invention. FIG. 6 is similar to FIG. 1. In the embodiment of FIG. 6, the tunable delay device 600 includes the oscillator 110, the counter 120, the output control circuit 130, and the delay circuit 199. In other words, the tunable delay device 600 includes the delay control device 100 and the delay circuit 199 as shown in FIG. 1. Other features of the tunable delay device 600 of FIG. 6 are similar to those of the delay control device 100 of FIG. 1. The repeated portions will not be discussed again herein.

Figure 7:
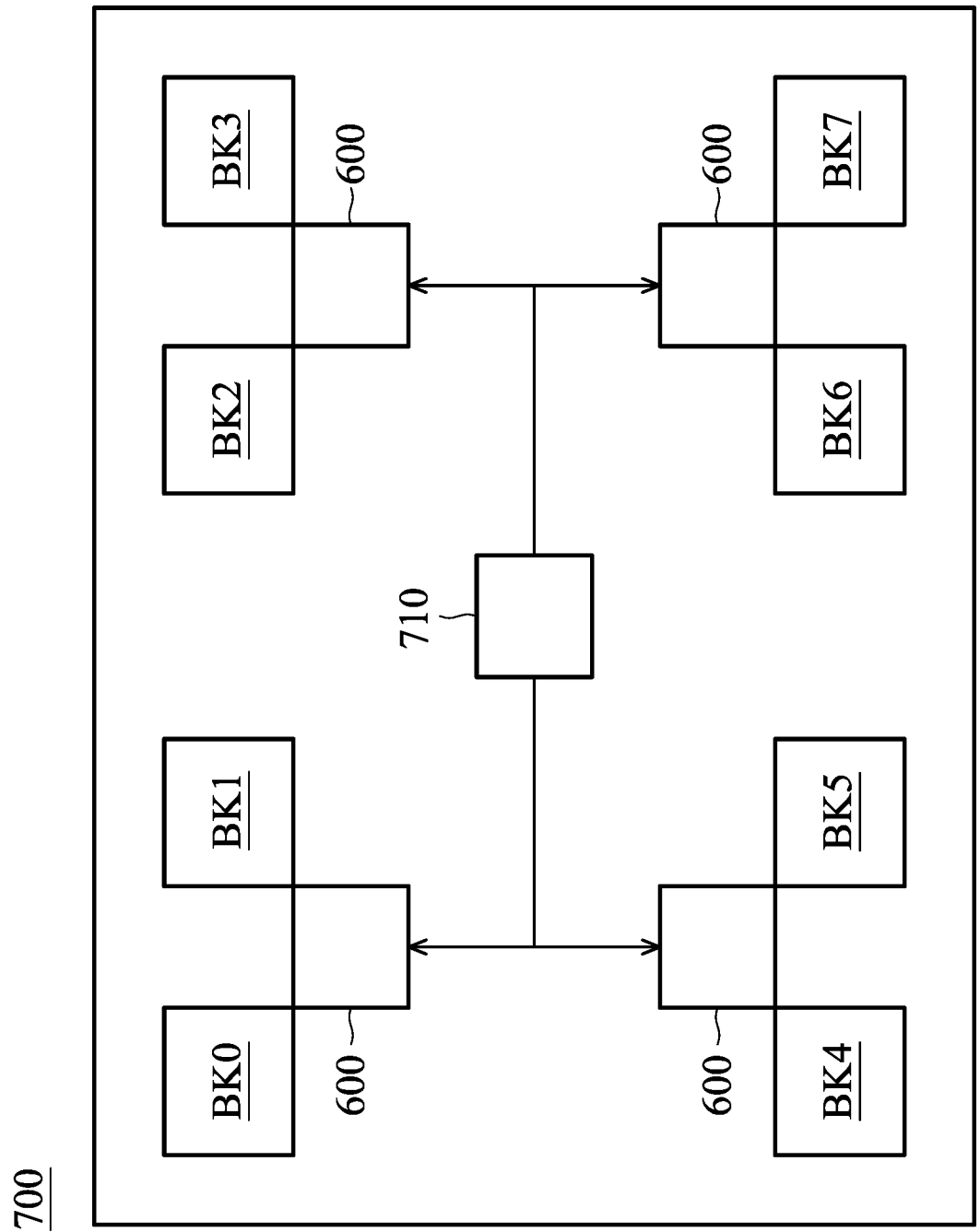
FIG. 7 is a diagram of a memory device according to an embodiment of the invention.

FIG. 7 is a diagram of a memory device 700 according to an embodiment of the invention. As shown in FIG. 7, the memory device 700 includes a plurality of memory banks BK0 to BK7, a plurality of tunable delay devices 600, and an external clock pad 710 for providing the external clock signal EXCK. Each tunable delay device 600 is disposed close to two adjacent memory banks, so as to provide the delay time TD for the adjacent memory banks. These tunable delay devices 600 are respectively coupled to the external clock pad 710 for receiving the external clock signal EXCK.

According to the delay control device 100 proposed by the invention, even if there are PVT variations or circuits at different positions, the delay control device 100 can still optimize the delay time TD of the delay circuit 199, thereby improving the overall operating performance of the related circuit.

It should be noted that the delay control device and the tunable delay device of the invention are not limited to the configurations of FIGS. 1-7. The invention may merely include any one or more features of any one or more embodiments of FIGS. 1-7. In other words, not all of the features displayed in the figures should be implemented in the delay control device and the tunable delay device of the invention. Although the embodiments of the invention use MOSFET as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A delay control device for controlling a delay circuit, comprising:
    an oscillator, generating an internal clock signal according to an external clock signal;
    a counter, generating an accumulative signal according to the internal clock signal, wherein the counter is selectively reset by the external clock signal; and
    an output control circuit, generating a delay indication signal according to the accumulative signal, wherein a delay time of the delay circuit is adjusted according to the delay indication signal.

2. The delay control device as claimed in claim 1, wherein the oscillator comprises:
    a NAND gate, wherein the NAND gate has a first input terminal for receiving the external clock signal, a second input terminal coupled to a first node, and an output terminal coupled to a second node;
    a first inverter, wherein the first inverter has an input terminal coupled to the second node, and an output terminal coupled to a third node; and
    a second inverter, wherein the second inverter has an input terminal coupled to the third node, and an output terminal coupled to the first node for outputting the internal clock signal.

3. The delay control device as claimed in claim 1, wherein the accumulative signal comprises a first bit, a second bit, a third bit, and a fourth bit.

4. The delay control device as claimed in claim 3, wherein the counter comprises:
    a first D flip-flop, wherein the first D flip-flop has a clock terminal for receiving the internal clock signal, an inverted reset terminal for receiving the external clock signal, a data terminal coupled to a fourth node, and an output terminal coupled to a fifth node for outputting the first bit; and
    a third inverter, wherein the third inverter has an input terminal coupled to the fifth node, and an output terminal coupled to the fourth node.

5. The delay control device as claimed in claim 4, wherein the counter further comprises:
    a first XOR gate, wherein the first XOR gate has a first input terminal coupled to a sixth node, a second input terminal coupled to the fifth node, and an output terminal coupled to a seventh node; and
    a second D flip-flop, wherein the second D flip-flop has a clock terminal for receiving the internal clock signal, an inverted reset terminal for receiving the external clock signal, a data terminal coupled to the seventh node, and an output terminal coupled to the sixth node for outputting the second bit.

6. The delay control device as claimed in claim 5, wherein the counter further comprises:
    a first AND gate, configured to receive the first bit and the second bit, wherein the first AND gate has an output terminal coupled to an eighth node;
    a second XOR gate, wherein the second XOR gate has a first input terminal coupled to a ninth node, a second input terminal coupled to the eighth node, and an output terminal coupled to a tenth node; and
    a third D flip-flop, wherein the third D flip-flop has a clock terminal for receiving the internal clock signal, an inverted reset terminal for receiving the external clock signal, a data terminal coupled to the tenth node, and an output terminal coupled to the ninth node for outputting the third bit.

7. The delay control device as claimed in claim 6, wherein the counter further comprises:
    a second AND gate, wherein the second AND gate has a first input terminal coupled to the eighth node, a second input terminal for receiving the third bit, and an output terminal coupled to an eleventh node;
    a third XOR gate, wherein the third XOR gate has a first input terminal coupled to a twelfth node, a second input terminal coupled to the eleventh node, and an output terminal coupled to a thirteenth node; and
    a fourth D flip-flop, wherein the fourth D flip-flop has a clock terminal for receiving the internal clock signal, an inverted reset terminal for receiving the external clock signal, a data terminal coupled to the thirteenth node, and an output terminal coupled to the twelfth node for outputting the fourth bit.

8. The delay control device as claimed in claim 3, wherein the delay indication signal comprises a temporary bit, a low-speed bit, a median-speed bit, and a high-speed bit.

9. The delay control device as claimed in claim 8, wherein the output control circuit comprises:
    a fifth D flip-flop, wherein the fifth D flip-flop has a clock terminal for receiving the second bit, a data terminal for receiving the external clock signal, and an output terminal for outputting the temporary bit.

10. The delay control device as claimed in claim 9, wherein the output control circuit further comprises:
a sixth D flip-flop, wherein the sixth D flip-flop has a clock terminal for receiving the third bit, a data terminal for receiving the external clock signal, and an output terminal for outputting the high-speed bit.

11. The delay control device as claimed in claim 10, wherein the output control circuit further comprises:
a NOR gate, configured to receive the temporary bit and the high-speed bit and output the low-speed bit.

12. The delay control device as claimed in claim 11, wherein the output control circuit further comprises:
a fourth inverter, wherein the fourth inverter has an input terminal for receiving the high-speed bit, and an output terminal coupled to a fourteenth node; and
a third AND gate, wherein the third AND gate has a first input terminal for receiving the temporary bit, a second input terminal coupled to the fourteenth node, and an output terminal for outputting the median-speed bit.

13. A tunable delay device, comprising:
an oscillator, generating an internal clock signal according to an external clock signal;
a counter, generating an accumulative signal according to the internal clock signal, wherein the counter is selectively reset by the external clock signal;
an output control circuit, generating a delay indication signal according to the accumulative signal; and
a delay circuit, wherein a delay time of the delay circuit is adjusted according to the delay indication signal.

14. The tunable delay device as claimed in claim 13, wherein the delay circuit comprises:
a first transistor, wherein the first transistor has a control terminal coupled to an input node, a first terminal coupled to a supply voltage, and a second terminal coupled to an output node;
a second transistor, wherein the second transistor has a control terminal coupled to the input node, a first terminal coupled to a fifteenth node, and a second terminal coupled to the output node; and
a third transistor, wherein the third transistor has a control terminal for receiving a bias voltage, a first terminal coupled to a ground voltage, and a second terminal coupled to the fifteenth node.

15. The tunable delay device as claimed in claim 14, wherein the first transistor is a PMOS transistor (P-type Metal Oxide Semiconductor Field Effect Transistor), and each of the second transistor and the third transistor is an NMOS transistor (N-type Metal Oxide Semiconductor Field Effect Transistor).

16. The tunable delay device as claimed in claim 14, wherein the delay indication signal comprises a temporary bit, a low-speed bit, a median-speed bit, and a high-speed bit, wherein the accumulative signal comprises a first bit, a second bit, a third bit, and a fourth bit, and wherein the delay circuit further comprises:
a fourth transistor, wherein the fourth transistor has a control terminal coupled to the output node, and a first terminal and a second terminal both coupled to a sixteenth node; and
a fifth inverter, wherein the fifth inverter has an input terminal for receiving the low-speed bit, and an output terminal coupled to the sixteenth node.

17. The tunable delay device as claimed in claim 16, wherein the delay circuit further comprises:
a fifth transistor, wherein the fifth transistor has a control terminal coupled to the output node, and a first terminal and a second terminal both coupled to a seventeenth node; and
a sixth inverter, wherein the sixth inverter has an input terminal for receiving the median-speed bit, and an output terminal coupled to the seventeenth node.

18. The tunable delay device as claimed in claim 17, wherein the delay circuit further comprises:
a sixth transistor, wherein the sixth transistor has a control terminal coupled to the output node, and a first terminal and a second terminal both coupled to an eighteenth node; and
a seventh inverter, wherein the seventh inverter has an input terminal for receiving the high-speed bit, and an output terminal coupled to the eighteenth node.

19. The tunable delay device as claimed in claim 18, wherein each of the fourth transistor, the fifth transistor, and the sixth transistor is an NMOS transistor (N-type Metal Oxide Semiconductor Field Effect Transistor).

20. The tunable delay device as claimed in claim 18, wherein an effective capacitance of the fourth transistor is smaller than an effective capacitance of the fifth transistor, and wherein the effective capacitance of the fifth transistor is smaller than an effective capacitance of the sixth transistor.

* * * * *